(12) United States Patent  
Matsunaga et al.

(10) Patent No.: US 6,864,583 B2
(45) Date of Patent: Mar. 8, 2005

(54) WIRING STRUCTURE OF SEMICONDUCTOR DEVICE

(75) Inventors: Noriaki Matsunaga, Chigasaki (JP);
Takamasa Usui, Kawasaki (JP);
Sachiyo Ito, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/401,791

(22) Filed: Mar. 31, 2003

(65) Prior Publication Data

US 2003/0205814 A1 Nov. 6, 2003

Related U.S. Application Data

(63) Continuation of application No. 09/527,222, filed on Mar. 16, 2000, now Pat. No. 6,559,548.

(30) Foreign Application Priority Data

Mar. 19, 1999 (JP) ............................................ 11-076350

(51) Int. Cl.[7] .......................... H01L 23/48; H01L 23/52; H01L 29/40; H01L 21/4763
(52) U.S. Cl. ....................... 257/759; 257/774; 257/758; 257/760; 257/762; 257/763; 257/765; 257/775; 438/622; 438/623; 438/624; 438/625; 438/626
(58) Field of Search ................................. 257/774, 762, 257/758–760, 763, 765, 775; 438/622–626

(56) References Cited

U.S. PATENT DOCUMENTS 4,354,104 A  * 10/1982  Chikamura et al. ......... 257/291

4,813,129 A  * 3/1989  Karnezos ...................... 29/832
5,169,680 A  * 12/1992  Ting et al. .................. 438/629

(List continued on next page.)

FOREIGN PATENT DOCUMENTS

JP            08241935         9/1996

OTHER PUBLICATIONS

L. Peters, Senior Editor, "Solving the Integration Challenges of Low–K Dielectrics", Semiconductor International, pp. 56–64, (1999).

T. Usui et al., "Significant Improvement in Electromigration of Reflow–Sputtered Al–0.5wt%/Cu/Nb–liner Dual Damascene Interconnects with Low–k Organic SOG Dielectric", IEEE 37th Annual International Reliability Physics Symposium, pp. 221 –226, (1999).

*Primary Examiner*—George Eckert
*Assistant Examiner*—Chris C. Chu
(74) *Attorney, Agent, or Firm*—Finnegan, Henderson, Farabow, Garrett & Dunner, L.L.P.

(57) ABSTRACT

A wiring layer is covered with a first organic SOG layer, a reinforcement insulating layer consisting of a silicon oxide film or a silicon nitride film formed by means of a plasma CVD method, and a second organic SOG layer, in this order. A via hole is formed in the first organic SOG layer and the reinforcement insulating layer, and a trench is formed in the second organic SOG layer to correspond to the via hole. A conductive via plug and an electrode pad are embedded in the via hole and the trench, respectively. The second SOG layer is covered with a passivation layer in which a through hole is formed to expose the electrode pad. A wire is connected to the exposed electrode pad in the through hole.

16 Claims, 9 Drawing Sheets

U.S. PATENT DOCUMENTS

| | | | |
|---|---|---|---|
| 5,380,546 A * | 1/1995 | Krishnan et al. | 427/126.1 |
| 5,430,329 A * | 7/1995 | Harada et al. | 257/786 |
| 5,643,407 A | 7/1997 | Chang | 156/644.1 |
| 5,738,931 A * | 4/1998 | Sato et al. | 428/209 |
| 5,739,579 A | 4/1998 | Chiang et al. | 257/635 |
| 5,753,975 A * | 5/1998 | Matsuno | 257/751 |
| 5,843,839 A * | 12/1998 | Ng | 438/637 |
| 5,879,808 A | 3/1999 | Wary et al. | 428/411.1 |
| 5,901,050 A * | 5/1999 | Imai | 361/820 |
| 5,904,556 A | 5/1999 | Suzuki et al. | 438/623 |
| 6,046,502 A | 4/2000 | Matsuno | 257/751 |
| 6,078,100 A * | 6/2000 | Duesman et al. | 257/690 |
| 6,184,143 B1 * | 2/2001 | Ohashi et al. | 438/697 |
| 6,197,688 B1 * | 3/2001 | Simpson | 438/678 |
| 6,197,696 B1 * | 3/2001 | Aoi | 438/700 |
| 6,261,944 B1 * | 7/2001 | Mehta et al. | 438/624 |
| 6,333,255 B1 * | 12/2001 | Sekiguchi | 438/622 |
| 6,340,601 B1 * | 1/2002 | Curran et al. | 438/4 |
| 6,731,007 B1 * | 5/2004 | Saito et al. | 257/762 |

* cited by examiner

WIRING STRUCTURE OF SEMICONDUCTOR DEVICE

This is a continuation of application Ser. No. 09/527,222, filed Mar. 16, 2000 now U.S. Pat. No. 6,559,548 which is incorporated in its entirety herein by reference.

CROSS-REFERENCE TO RELATED APPLICATIONS

This application is based upon and claims the benefit of priority from the prior Japanese Patent Application No. 11-076350, filed Mar. 19, 1999, the entire contents of which are incorporated herein by reference.

BACKGROUND OF THE INVENTION

The present invention relates to a wiring structure of a semiconductor device and a method of fabricating the same, and particularly to a technique of preventing a crack from being generated in an inter-level insulating film under an electrode pad when a connecting member, such as a wire or a bump, is bonded to the electrode pad.

In recent years, in order to allow LSIs to operate at a higher speed, an insulating film having a lower dielectric constant is used as an inter-level insulating film. For this reason, a silicon oxide film containing an organic substance formed by means of an SOG (Spin-On-Glass) method, which will be referred to as an SOG film or layer, has come into use as an inter-level insulating film, in place of an $SiO_2$ film formed by means of a CVD (Chemical Vapor Deposition) method, such as a silicon oxide film formed by using TEOS (tetraethyl orthosilicate), which is referred to as a TEOS film or layer. This is because the SOG film has a dielectric constant lower than that of the TEOS film.

However, the SOG film has a mechanical strength lower than the TEOS film, and has a hardness about one tenth that of the TEOS film. Furthermore, the TEOS film is formed to have a compressive stress. On the other hand, the SOG film has a coefficient of linear expansion higher than that of an Si substrate, and thus the SOG film is formed to have a tensile stress, by means of a present film-formation method with no stress control. Under such circumstances the organic SOG film is apt to easily generate a crack when pressure is applied to the film.

This problem appears most seriously in a step of bonding a connecting member, such as a wire, a bump, or an anisotropic conductivity sheet, to an electrode pad. Specifically, due to pressure applied to the electrode pad during the bonding, a crack is generated in an SOG film directly under the pad. In this respect, FIGS. 10A to 10F are cross-sectional views showing steps of a conventional method of fabricating a wiring structure of a semiconductor device.

First, as shown in FIG. 10A, a wiring layer 2 is formed on an insulating layer 1, and, then, is covered with an organic SOG layer 3. Then, as shown in FIG. 10B, a via hole 4 relative to the wiring layer 2 is formed in the SOG layer 3. Then, Al is deposited over the resultant structure to form an Al film 5 on the SOG layer 3 and in the via hole 4.

Then, as shown in FIG. 10C, the Al film 5 is patterned to form an Al electrode pad 6 by means of lithography and a following RIE (Reactive Ion Etching) method. Then, as shown in FIG. 10D, a passivation layer 7 consisting of, e.g., an organic SOG film, a plasma CVD silicon oxide film, or a plasma CVD silicon nitride film, is formed over the resultant structure.

Then, as shown in FIG. 10E, a through hole 8 is formed in the passivation layer 7 to expose the Al pad 6. Thereafter, dicing and mounting are performed for assembling, and, then, as shown in FIG. 10F, wire bonding is performed relative to the Al pad 6. At this time, a wire 9 is brought into close contact with the Al pad 6 such that pressure is applied to the pad 6, whereby the wire 9 is connected to the pad 6.

In this wire bonding process, a problem arises in that a crack is generated in the SOG layer 3 directly under the pad 6.

BRIEF SUMMARY OF THE INVENTION

An object of the present invention is to provide a wiring structure of a semiconductor device and a method of fabricating the same which allow an inter-level insulating film to have a lower dielectric constant, and which, on the other hand, prevent a crack from being generated in the inter-level insulating film under an electrode pad when a connecting member, such as a wire, is bonded to the electrode pad.

According to a first aspect of the present invention, there is provided a wiring structure of a semiconductor device comprising:

a wiring layer arranged on a substrate;

an inter-level insulating film covering the wiring layer and having a via hole formed to correspond to the wiring layer;

a conductive via plug arranged in the via hole; and an electrode pad arranged on the inter-level insulating film and electrically connected to the wiring layer by the via plug;

wherein the inter-level insulating film comprises a first insulating layer having a relative dielectric constant of 3.0 or less, and a Young's modulus of less than 50 GPa, and a second insulating layer having a Young's modulus of 50 GPa or more, and intervening between the first insulating layer and the electrode pad.

According to a second aspect of the present invention, there is provided a wiring structure of a semiconductor device comprising:

a plurality of wiring layers arranged at different levels on a substrate;

a plurality of first insulating layers covering the wiring layers of the different levels, respectively, and having via holes formed to correspond to the wiring layers, respectively, the first insulating layers each having a relative dielectric constant of 3.0 or less, a Young's modulus of 10 GPa or less, and a density of less than 2.0 $g/cm^3$;

conductive via plugs arranged in the via holes, respectively;

an electrode pad arranged on an uppermost first insulating layer located at an uppermost position among the fist insulating layers, and electrically connected to one of the wiring layers by one of the via plugs; and a second insulating layer intervening between the uppermost first insulating layer and the electrode pad, and having a Young's modulus of 50 GPa or more.

According to a third aspect of the present invention, there is provided a wiring structure of a semiconductor device comprising:

a plurality of wiring layers arranged at different levels on a substrate;

a plurality of first insulating layer arranged at levels substantially the same as those of the wiring layer of the different levels to surround the wiring layers, respectively, the first insulating layers each having a relative dielectric constant of 3.0 or less, a Young's modulus of 10 GPa or less, and a density of less than 2.0 g/cm$^3$;

a plurality of second insulating layers arranged to cover the wiring layers and the first insulating layers of the different levels, respectively, and having via holes formed to correspond to the wiring layers, respectively, the second insulating layers each having a Young's modulus of 50 GPa or more;

conductive via plugs arranged in the via holes, respectively; and an electrode pad arranged on an uppermost second insulating layer located at an uppermost position among the second insulating layers, and electrically connected to one of the wiring layers by one of the via plugs.

According to a fourth aspect of the present invention, there is provided a method of fabricating a wiring structure of a semiconductor device comprising:

covering a wiring layer arranged on a substrate with an inter-level insulating film which comprises a first insulating layer having a relative dielectric constant of 3.0 or less, and a Young's modulus of less than 50 GPa, and a second insulating layer having a Young's modulus of 50 GPa or more and staked on the first insulating layer;

forming a via hole in the inter-level insulating film to correspond to the wiring layer;

forming a conductive via plug in the via hole, and forming an electrode pad on the second insulating layer of the inter-level insulating film, such that the electrode pad is electrically connected to the wiring layer by the via plug; and electrically connecting a connecting member to the electrode pad while applying pressure to the electrode pad.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
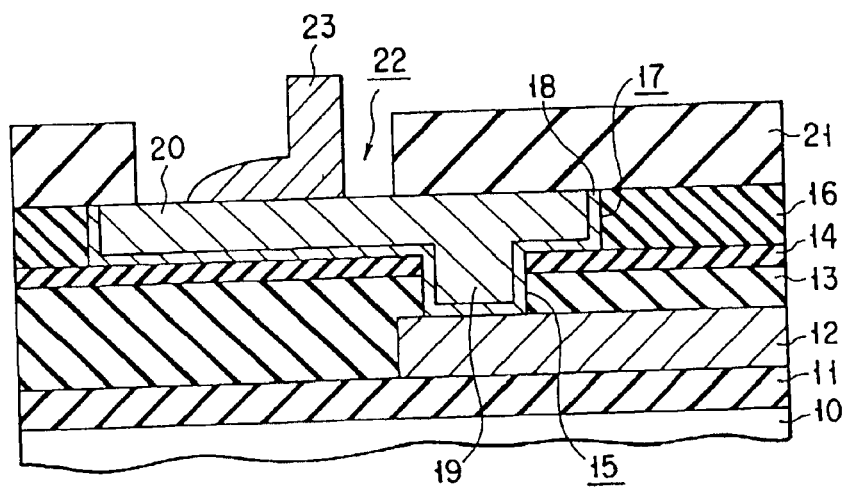
FIG. 1 is a cross-sectional view showing a wiring structure of a semiconductor device according to a first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

First Embodiment

FIG. 1 is a cross-sectional view showing a wiring structure of a semiconductor device according to the first embodiment of the present invention.

On a semiconductor substrate 10, a wiring layer 12 is arranged on an insulating layer 11. The insulating layer 11 and the wiring layer 12 are covered with a first organic SOG layer 13 (of, e.g., SiO(CH$_3$)$_x$, with a relative dielectric constant of 2.5, a Young's modulus of less than 10 GPa, and a density of less than 2.0 g/cm$^3$) formed by means of a spin coating method. The first SOG layer 13 is covered with a reinforcement insulating layer 14 (with a Young's modulus of 50 GPa or more, and a density of 2.0 g/cm$^3$ or more) consisting of a silicon oxide film (with a relative dielectric constant of 4.0) or a silicon nitride film (with a relative dielectric constant of 7.0) formed by means of a plasma CVD method. A via hole 15 relative to the wiring layer 12 is formed in the first SOG layer 13 and the reinforcement insulating layer 14. The plasma CVD SiO$_2$ layer 14 is covered with a second SOG layer 16 in which a trench 17 is formed in an area including the via hole 15.

The surface of the via hole 15 and the trench 17 is covered with a liner layer 18. Furthermore, a conductive via plug 19 and an electrode pad 20 are embedded in the via hole 15 and the trench 17, respectively. The second SOG layer 16 is covered with a passivation layer 21 in which a through hole 22 is formed to expose the pad 20. A wire 23 is connected to the exposed portion of the pad 20 in the hole 22.

FIGS. 2A to 2G are cross-sectional views showing steps of a method of fabricating the wiring structure shown in FIG. 1.

Figure 2A:
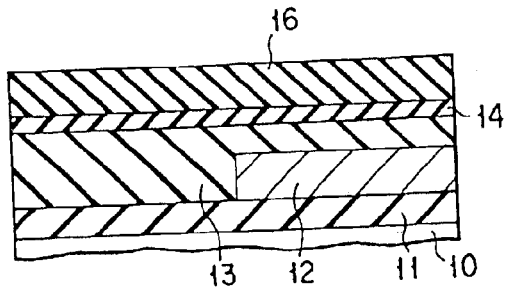
FIGS. 2A to 2G are cross-sectional views showing steps of a method of fabricating the wiring structure shown in FIG. 1.

First, as shown in FIG. 2A, on the semiconductor substrate 10, the wiring layer 12 is formed on the insulating layer 11, and the first organic SOG layer 13 is formed to cover the layers 11 and 12. Then, a silicon oxide film or a silicon nitride film is formed as the reinforcement insulating layer 14 on the first SOG layer 13 by means of a plasma CVD method. Then, the second organic SOG layer 16 is formed on the reinforcement insulating layer 14.

Figure 2E:
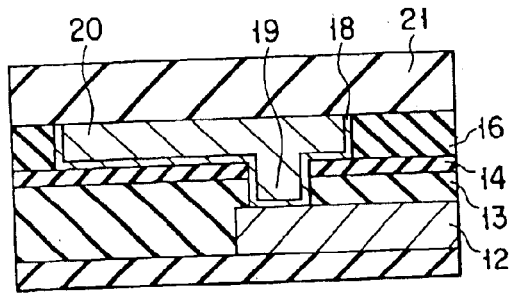
Figure 2B:
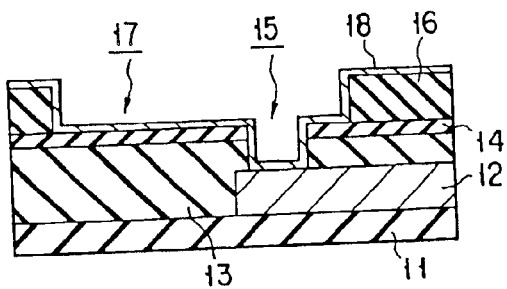

Then, as shown in FIG. 2B, the trench 17 is formed in the second SOG layer 16 to correspond to an area including at least the wiring layer 12 thereunder. Then, the via hole 15 is formed to be connected to the wiring layer 12, in the reinforcement insulating layer 14 exposed in the trench 17 and the first SOG layer 13. Then, Ti, TiN, Nb, Ta, or TaAl is deposited over the resultant structure to form the liner layer 18.

Figure 2F:
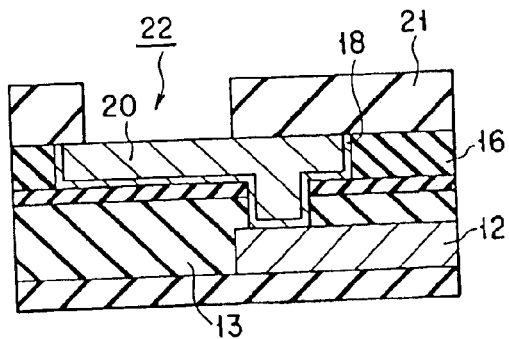
Figure 2C:
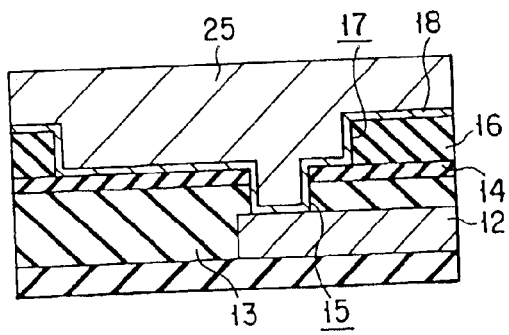

Then, as shown in FIG. 2C, an Al layer 25 is deposited to fill the via hole 15 and the trench 17 with the Al layer 25 by means of a reflow sputtering method. Then, as shown in FIG. 2D, those parts of the liner layer 18 and the Al layer 25 which are positioned on the second SOG layer 16 outside the trench 17 are removed by means of a CMP (Chemical-Mechanical Polishing) method. Consequently, the via plug 19 and the electrode pad 20 are embedded in the via hole 15 and the trench 17, respectively.

Then, as shown in FIG. 2E, a passivation layer 21 consisting of, e.g., an organic SOG film, a plasma CVD $SiO_2$ film, or a plasma CVD silicon nitride film, is formed over the resultant structure. Then, as shown in FIG. 2F, the through hole 22 is formed in the passivation layer 21 to expose at least part of the pad 20.

Figure 2G:
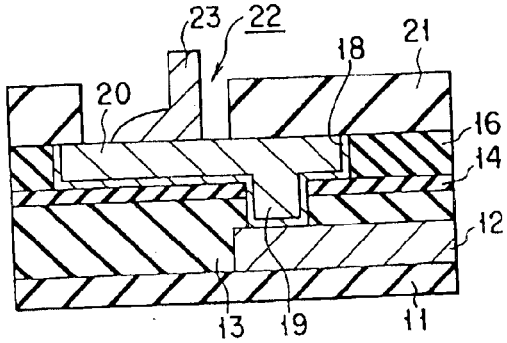
Figure 2D:
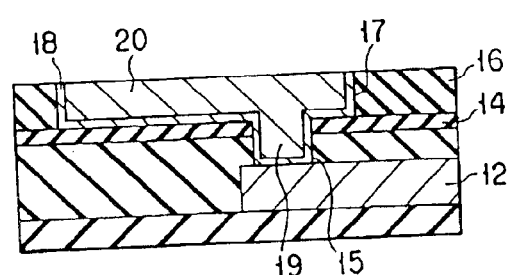

Thereafter, dicing and mounting are performed for assembling, and, then, as shown in FIG. 2G, the wire 23 is brought into close contact with the Al pad 20 such that pressure is applied to the pad 20. By doing so, so called wire bonding is performed to connect the wire 23 to the pad 20.

It was confirmed by an experiment that, in this wire bonding process, no cracks were generated in the reinforcement insulating layer 14 and the SOG layer 13 under the electrode pad 20. An explanation will be given to the reason as to why no cracks were generated in the first SOG layer 13.

Figure 3:
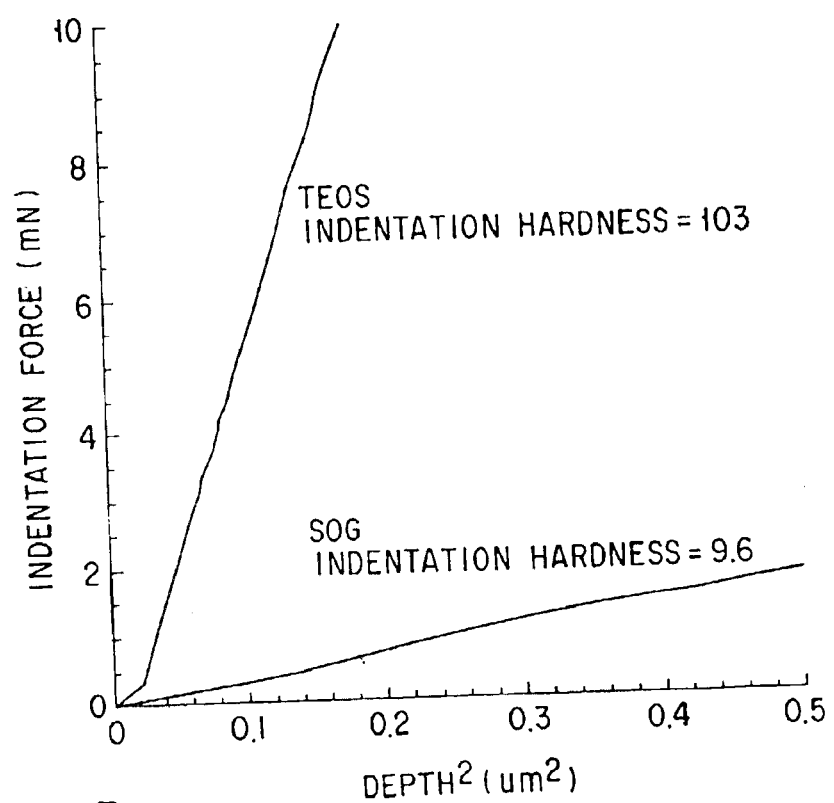
FIG. 3 is a graph showing measured hardness of an organic SOG film and a P—SiO$_2$ film (TEOS film)

FIG. 3 is a graph showing measured hardness of an organic SOG film and a P—$SiO_2$ film (TEOS film). The symbol "P—" means that the film is formed by means of a plasma CVD method. As shown in FIG. 3, the SOG film, which is a silicon oxide film containing an organic substance, has a hardness smaller than that of the P—$SiO_2$ film (TEOS film), and is apt to generate a crack at a very small load. For this reason, in conventional structures, a crack is generated in an SOG layer under an electrode pad, when pressure is applied to the pad during wire bonding.

TABLE 1 shows the Young's moduli of an organic SOG film, a plasma CVD silicon oxide film (P—$SiO_2$), a plasma CVD silicon nitride film (P—SiN), and so forth.

TABLE 2 shows a relationship between the thickness of an insulating film to be used as a reinforcement insulating layer under an electrode pad and crack generation in an organic SOG layer thereunder during the wire bonding TABLE 3 shows a relationship between the Young's modulus and the density of an insulating film to be used as reinforcement insulating layer under an electrode pad and crack generation in an organic SOG layer thereunder during the wire bonding.

TABLE 1

| Insulating film | Young's modulus (GPa) |
|---|---|
| Organic SOG | 8 |
| Hydropolysilazane | 7 |
| Polyimide | 7 |
| P-$SiO_2$ | 57 |
| Thermal-$SiO_2$ | 70 |
| P-SiN | 98 |

TABLE 2

| Thickness of P-SiN or P-$SiO_2$ (nm) | Crack resistance |
|---|---|
| 50 | X |
| 70 | X |
| 100 | ○ |
| 150 | ○ |
| 200 | ○ |
| 400 | ○ |

TABLE 3

| Insulating film | Young's modulus (GPa) | Density (g/cm$^3$) | Crack resistance |
|---|---|---|---|
| SOG {Si(CH$_3$)O$_3$/2} | 8 | <1.5 | X |
| P-$SiO_2$ {SiH$_4$} | 57 | <2.0 | ○ |
| P-$SiO_2$ {TEOS} | 57 | <2.0 | ○ |
| Thermal-$SiO_2$ | 70 | <2.2 | ○ |
| P-SiN$_X$ | 98 | 2.5–2.8 | ○ |

As shown in TABLE 1, the plasma CVD silicon oxide film and the plasma CVD silicon nitride film have Young's moduli (and hardnesses) 4 to 30 times larger than that of the organic SOG film. In the embodiment described above, a plasma CVD silicon oxide film or a plasma CVD silicon nitride film which is very hard is arranged between the electrode pad 20 and the first SOG layer 13. Accordingly, no cracks are generated in the first SOG layer 13 during the wire bonding.

As shown in TABLE 3, where an insulating film having a Young's modulus of 57 GPa or more or having a density of 2.0 g/cm$^3$ or more is used as the reinforcement insulating layer, no cracks are generated in the organic SOG layer thereunder. Although the lower limit of Young's modulus is 57 GPa to prevent a crack from being generated in the organic SOG in TABLE 3, an insulating film having a Young's modulus of about 50 GPa, used as the reinforcement insulating layer, can prevent a crack from being generated in the organic SOG. Furthermore, the thickness of the reinforcement insulating layer is preferably set to be smaller than that of the organic SOG layer, and preferably set to be 100 nm or more, as shown in TABLE 2.

According to this embodiment, the reinforcement insulating layer consisting of a silicon oxide film or a silicon nitride film formed by means of a plasma CVD method intervenes between the organic SOG layer and the electrode pad. Accordingly, no cracks are generated in the organic SOG layer under the pad during the wire bonding.

Second Embodiment

FIGS. 4A to 4H are cross-sectional views showing steps of a method of fabricating a wiring structure of a semiconductor device according to the second embodiment of the present invention. Where a reinforcement insulating layer is arranged all over an organic SOG layer, an advantage obtained by the low dielectric constant of the SOG layer becomes smaller. In this respect, this embodiment relates to a method of arranging a reinforcement insulating layer only at the bottom of an electrode pad.

Figure 4A:
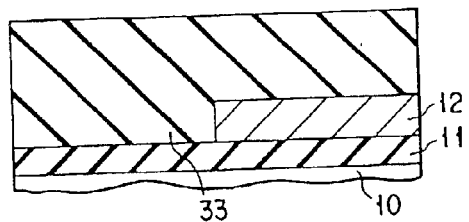
FIGS. 4A to 4H are cross-sectional views showing steps of a method of fabricating a wiring structure of a semiconductor device according to a second embodiment of the present invention.

First, as shown in FIG. 4A, on a semiconductor substrate 10, a wiring layer 12 is formed on an insulating layer 11, and an organic SOG layer 33 is formed to cover the layers 11 and 12.

Figure 4E:
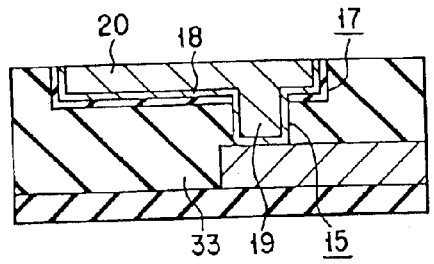
Figure 4B:
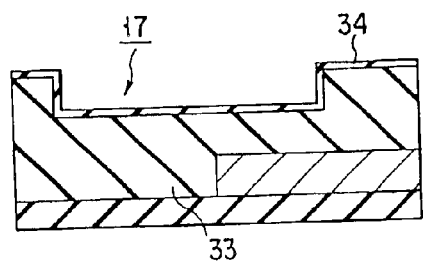

Then, as shown in FIG. 4B, a trench 17 is formed in the SOG layer 33 to correspond to an area including at least the wiring layer 12 thereunder. Then, an SiO$_2$ film or a silicon nitride film is formed as a reinforcement insulating layer 34 by means of a plasma CVD method. Preferably, the thickness of the reinforcement insulating layer 34 is set to be 100 nm or more. Then, as shown in FIG. 4C, a via hole 15 is formed to be connected to the wiring layer 12, in the bottom of the trench 17.

Figure 4F:
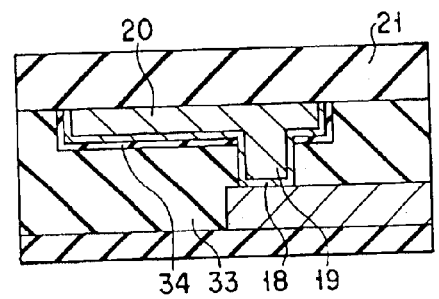
Figure 4C:
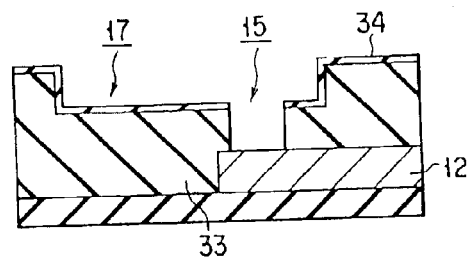
Figure 4G:
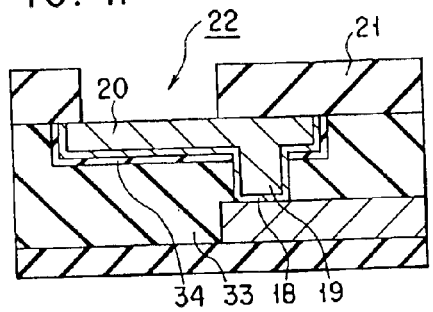
Figure 4D:
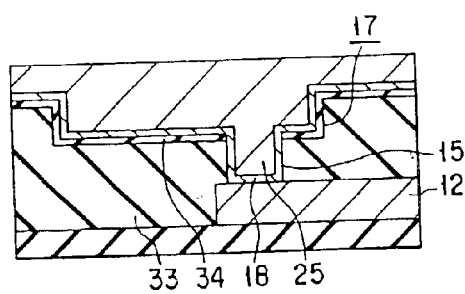

Then, as shown in FIG. 4D, Ti, TiN, Nb, Ta, or TaAl is deposited over the resultant structure to form a liner layer 18. Then, an Al layer 25 is deposited to fill the via hole 15 and the trench 17 with the Al layer 25 by means of a reflow sputtering method.

Then, as shown in FIG. 4E, those parts of the Al layer 25, the liner layer 18, and the reinforcement insulating layer 34 which are positioned on the SOG layer 33 outside the trench 17 are removed by means of a CMP method. Consequently, a via plug 19 and an electrode pad 20 are embedded in the via hole 15 and the trench 17, respectively.

Then, as shown in FIG. 4F, a passivation layer 21 consisting of, e.g., an organic SOG film, a plasma CVD SiO$_2$ film, or a plasma CVD silicon nitride film, is formed over the resultant structure. Then, as shown in FIG. 4G, a through hole 22 is formed in the passivation layer 21 to expose at least part of the pad 20.

Figure 4H:
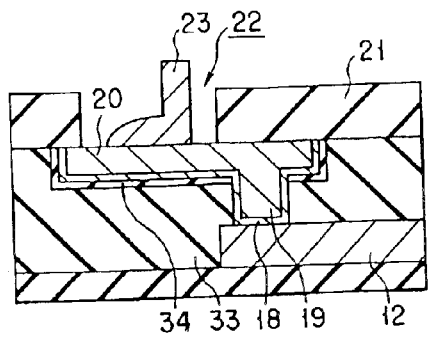

Thereafter, dicing and mounting are performed for assembling, and, then, as shown in FIG. 4H, a wire 23 is brought into close contact with the Al pad 20 such that pressure is applied to the pad 20. By doing so, so called wire bonding is performed to connect the wire 23 to the pad 20.

It was confirmed by an experiment that, in this wire bonding process, no cracks were generated in the SOG layer 33 under the electrode pad 20. This is because the reinforcement insulating layer 34 consisting of a silicon oxide film or a silicon nitride film formed by means of a plasma CVD method intervenes between the organic SOG layer 33 and the electrode pad 20.

Third Embodiment

FIGS. 5A to 5D are cross-sectional views showing steps of a method of fabricating a wiring structure of a semiconductor device according to the third embodiment of the present invention. This embodiments relates to a case where Cu is used as a wiring material, which causes a problem in that bonding of an Al bonding wire to the wiring layer is deteriorated.

Figure 5A:
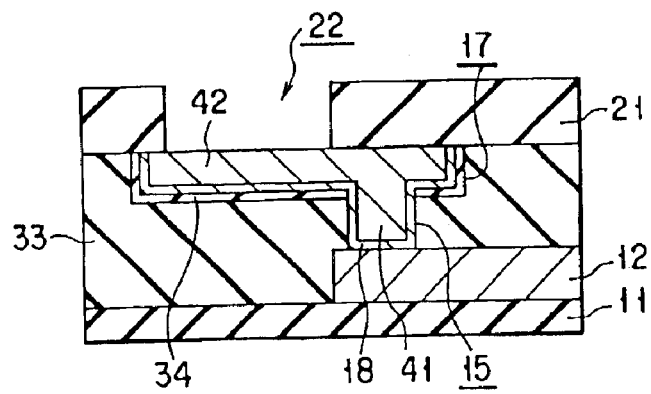
FIGS. 5A to 5D are cross-sectional views showing steps of a method of fabricating a wiring structure of a semiconductor device according to a third embodiment of the present invention.

First, the structure shown in FIG. 5A is fabricated in accordance with the steps described in the second embodiment with reference to FIGS. 4A to 4G, except that the wiring layer is formed of Cu, (and thus their detailed explanation is omitted). Accordingly, in FIG. 5A, a Cu via plug 41 and a Cu electrode pad 42 are embedded in a via hole 15 and an trench 17, respectively. Furthermore, this embodiment has a passivation layer 21 consisting of a silicon nitride film.

Figure 5B:
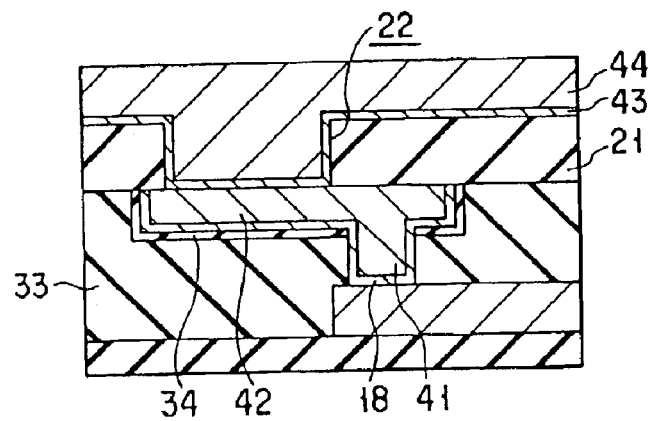

Then, as shown in FIG. 5B, a TiN film or a TaN film is deposited over the resultant structure to form a barrier layer 43. Then, an Al film 44 is deposited to fill a through hole 22 with the Al film 44 by means of a sputtering method.

Figure 5C:
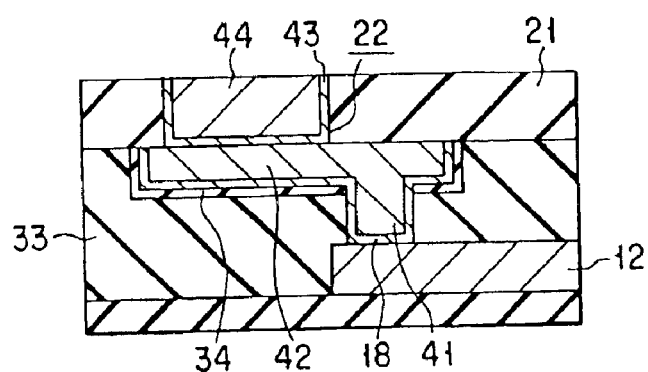

Then, as shown in FIG. 5C, those parts of the Al film 44 and the barrier layer 43 which are positioned on the passivation layer 21 outside the through hole 22 are removed to form an Al pad 44 in the through hole 22.

Figure 5D:
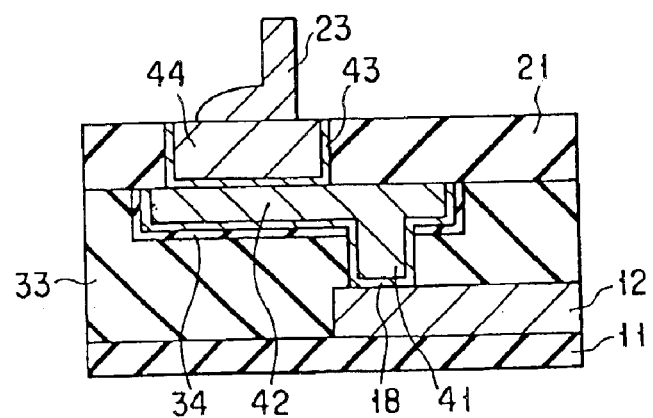

Thereafter, dicing and mounting are performed for assembling, and, then, as shown in FIG. 5D, a wire 23 is brought into close contact with the Al pad 44 such that pressure is applied to the pad 44. By doing so, so called wire bonding is performed to connect the wire 23 to the pad 44.

It was confirmed by an experiment that, in this wire bonding process, no cracks were generated in the SOG layer 33 under the electrode pads 42 and 44. This is because the reinforcement insulating layer 34 consisting of a silicon oxide film or a silicon nitride film formed by means of a plasma CVD method intervenes between the organic SOG layer 33 and the Cu pad 42.

Fourth Embodiment

FIGS. 6A to 6F are cross-sectional views showing steps of a method of fabricating a wiring structure of a semiconductor device according to the fourth embodiment of the present invention.

Figure 6A:
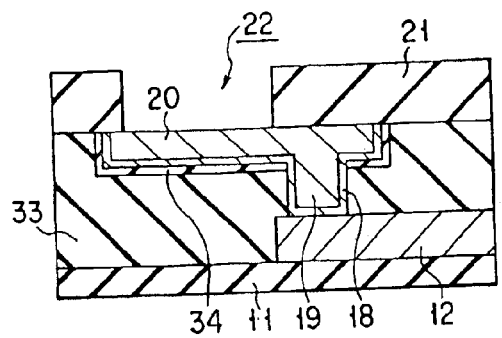
FIGS. 6A to 6F are cross-sectional views showing steps of a method of fabricating a wiring structure of a semiconductor device according to a fourth embodiment of the present invention.

First, the structure shown in FIG. 6A is fabricated in accordance with the steps described in the second embodiment with reference to FIGS. 4A to 4G, (and thus their detailed explanation is omitted).

Figure 6D:
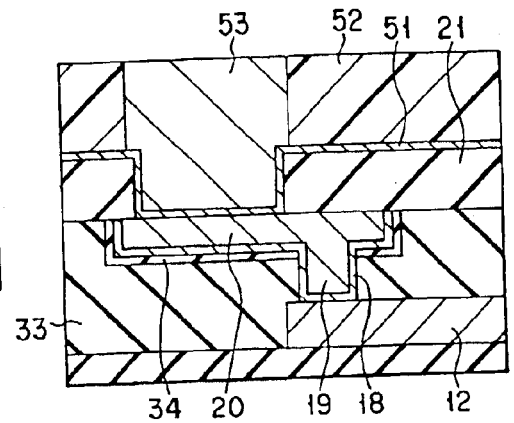
Figure 6B:
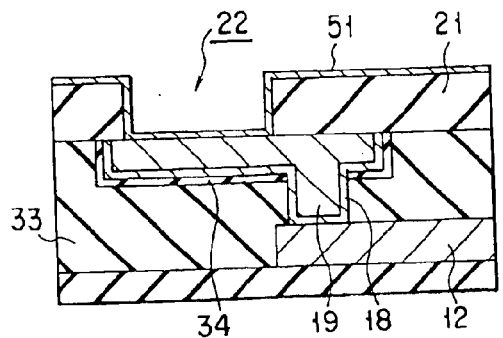
Figure 6E:
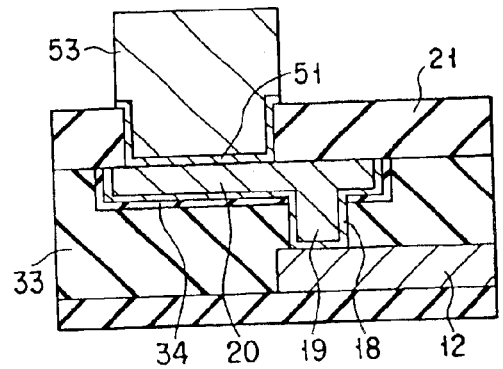
Figure 6C:
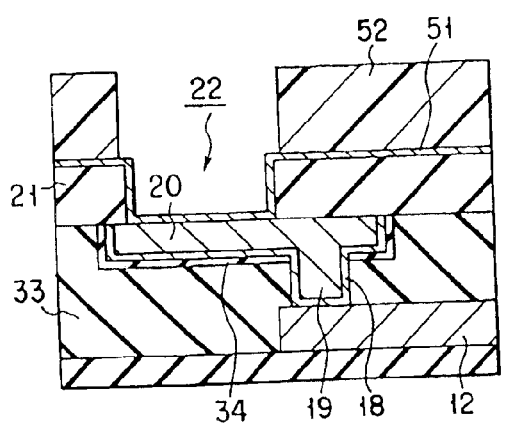

Then, as shown in FIG. 6B, a barrier layer 51 is formed to have a Ti/Ni/Pd or Ti/TiW/Au multi layer structure. Then, as shown in FIG. 6C, a photo-resist is applied over the resultant structure and is processed by means of a lithography method to form a resist pattern 52, which has an opening exposing a through hole 22.

Then, as shown in FIG. 6D, Au or solder is embedded through the opening of the resist pattern 52 above the pad 20 to form a bump 53 by means of an electrolyte plating method. Then, as shown in FIG. 6E, the resist pattern 52 is removed, and the exposed portion of the barrier layer 51 is removed, using the bump 53 as a mask.

Figure 6F:
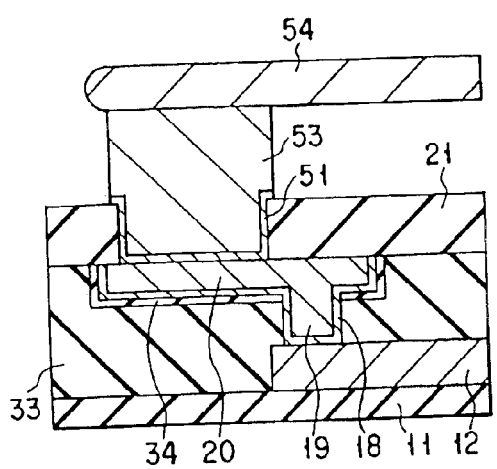

Thereafter, wrapping on the backside and dicing are performed, and, then, as shown in FIG. 6F, a lead tape 54 is brought into close contact with the bump 53. Then, the tape 54 and the bump 53 are heated up to about 500° C. along with pressure applied thereon, so that bonding is performed.

It was confirmed by an experiment that, in this bonding process, no cracks were generated in the SOG layer 33 under the electrode pads 20. This is because the reinforcement insulating layer 34 consisting of a silicon oxide film or a silicon nitride film formed by means of a plasma CVD method intervenes between the organic SOG layer 33 and the electrode pad 20.

Fifth Embodiment

FIGS. 7A to 7E are cross-sectional views showing steps of a method of fabricating a wiring structure of a semiconductor device according to the fifth embodiment of the present invention.

In this embodiment, a transistor 61 of the MIS (Metal-Insulator-Semiconductor) type is arranged on an Si substrate 60. The transistor 61 has a pair of source/drain layers 62 and 63 formed in the substrate 60, and a gate electrode 64 arranged on a channel region through an insulating film.

Figure 7A:
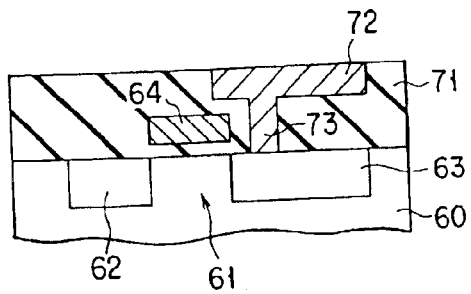
FIGS. 7A to 7E are cross-sectional views showing steps of a method of fabricating a wiring structure of a semiconductor device according to a fifth embodiment of the present invention.

First, as shown in FIG. 7A, the substrate 60 is covered all over by an insulating layer 71 consisting of a BPSG (B-doped Phospho-Silicate Glass) film. Then, a W wiring layer 72 is formed on the insulating layer 71 and connected to the transistor 61 by a via plug 73.

Figure 7B:
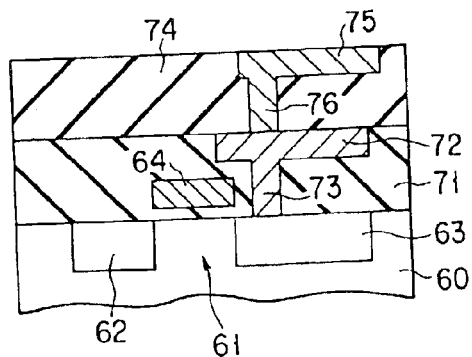

Then, as shown in FIG. 7B, the insulating layer 71 and the wiring layer 72 are covered with an insulating layer 74 consisting of an organic SOG layer (of, e.g., $SiO(CH_3)_x$, with a relative dielectric constant of 2.5, a Young's modulus of less than 10 GPa, and a density of less than 2.0 g/cm$^3$) formed by means of a spin coating method. Then, a Cu/TaN wiring layer 75 is formed on the insulating layer 74 and connected to the wiring layer 72 by a via plug 76.

Figure 7C:
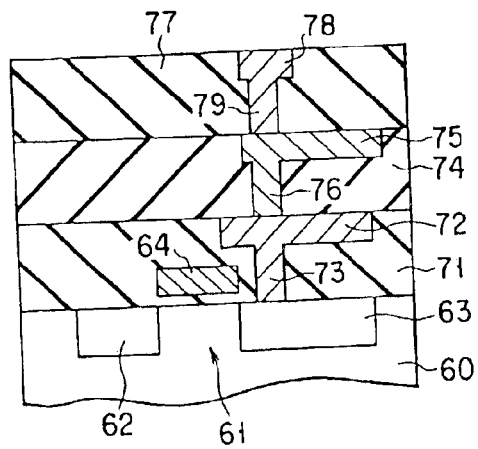

Then, as shown in FIG. 7C, the insulating layer 74 and the wiring layer 75 are covered with an insulating layer 77 consisting of an organic SOG layer. Then, a Cu/TaN wiring layer 78 is formed on the insulating layer 77 and connected to the wiring layer 75 by a via plug 79.

Figure 7D:
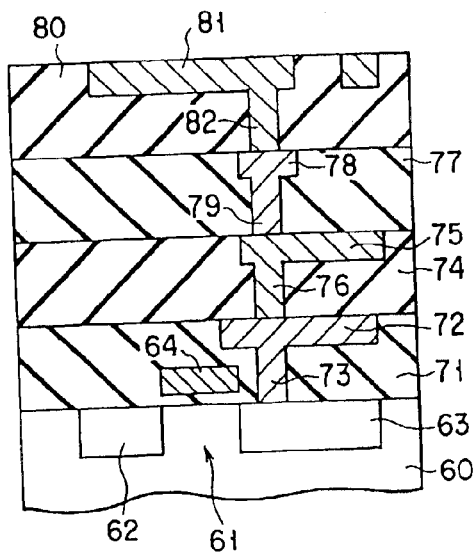

Then, as shown in FIG. 7D, the insulating layer 77 and the wiring layer 78 are covered with a reinforcement insulating layer 80 (with a Young's modulus of 50 GPa or more, and a density of 2.0 g/cm$^3$ or more) consisting of a silicon oxide film formed by means of a plasma CVD method. Then, a Cu/TaN pad and wiring layer 81 is formed on the insulating layer 80 and connected to the wiring layer 78 by a via plug 82.

Figure 7E:
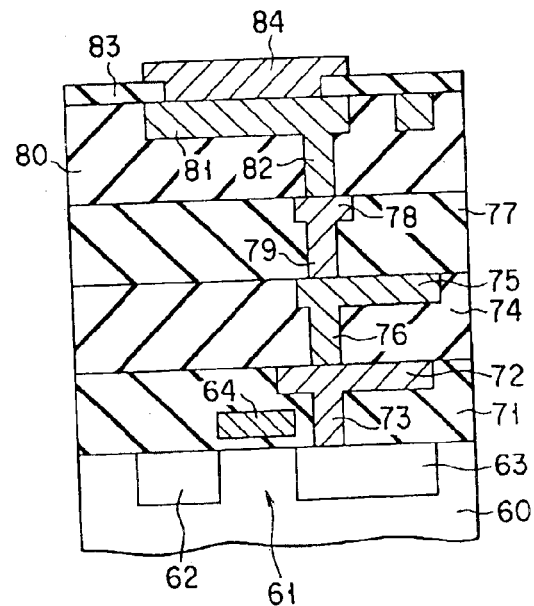

Then, as shown in FIG. 7E, the insulating layer 80 and the pad and wiring layer 81 are covered with a passivation layer 83 consisting of a silicon nitride film formed by means of a plasma CVD method. Then, a through hole is formed in the passivation layer 83 and an Al/BM (Barrier Metal) electrode pad 84 is formed in the through hole.

In this structure, the reinforcement insulating layer 80 consisting of a silicon oxide film formed by means of a plasma CVD method is arranged directly under the electrode pads 81 and 84. As a result, the structure can withstand a mechanical impact applied thereto in a bonding step. On the other hand, the SOG insulating layers 74 and 77 having a low dielectric constant are used as intermediate insulating layers, thereby realizing a semiconductor device which can operate at a higher speed.

As shown in FIG. 7E, the Al electrode pad 84 (including a BM of, e.g., Ti/TiN) is formed of a lid arranged on the Cu pad and wiring layer 81 (including TaN). This is because, if a Cu surface is exposed at the uppermost surface, problems arise in that bonding strength becomes low, and the surface is oxidized or corroded. An electrode pad sometimes has a multi-layer structure formed of laminated metal layers as in this case. In such cases, the laminated layers should be considered as an integrated electrode, and a reinforcement insulating layer having a high mechanical strength is arranged directly under the integrated electrode.

Sixth Embodiment

FIGS. 8A to 8F are cross-sectional views showing steps of a method of fabricating a wiring structure of a semiconductor device according to the sixth embodiment of the present invention.

Figure 8A:
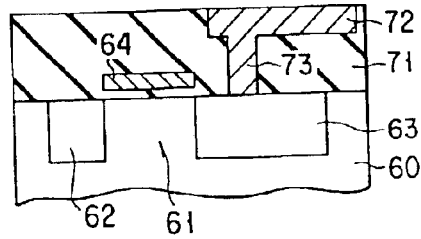
FIGS. 8A to 8F are cross-sectional views showing steps of a method of fabricating a wiring structure of a semiconductor device according to a sixth embodiment of the present invention.

First, the structure shown in FIG. 8A, which is the same as that shown in FIG. 7A, is formed by the step as described above.

Figure 8B:
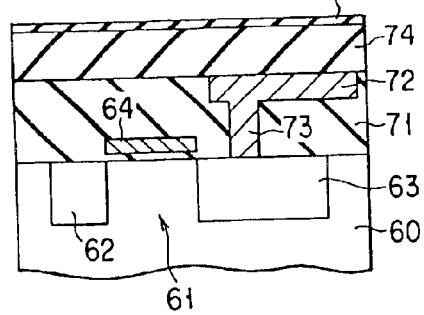

Then, as shown in FIG. 8B, an insulating layer 71 and an wiring layer 72 are covered with an insulating layer 74 consisting of an organic SOG layer and having a thickness of 300 nm. Then, the insulating layer 74 is covered with an insulating layer 86a consisting of a silicon oxide film or a silicon nitride film formed by means of a plasma CVD method and having a thickness of 50 nm. The insulating layer 86a is utilized as an etching stopper for forming a wiring layer.

Figure 8E:
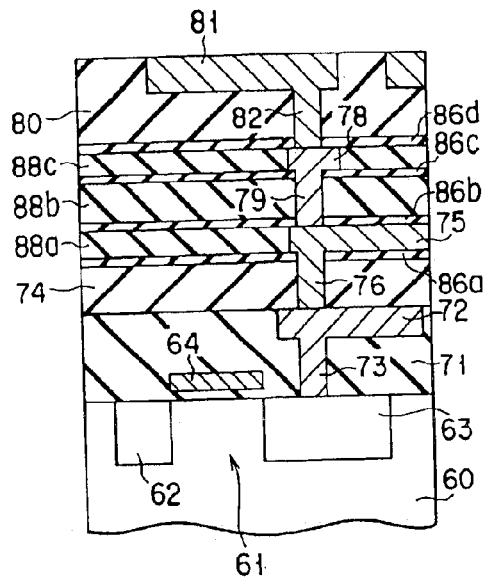
Figure 8C:
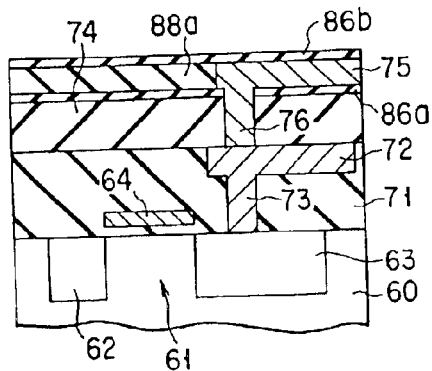

Then, as shown in FIG. 8C, the insulating layer 86a is covered with an insulating layer 88a consisting of an organic SOG layer formed by means of a spin coating method. Then, the insulating layers 74, 86a, and 88a are subjected to a step of patterning and a step of forming a trench, and Cu/TaN is embedded in the trench to form a wiring layer 75 and a via plug 76 (dual damascene method). Then, the insulating layer 88a and the wiring layer 75 are covered with an insulating layer 86b consisting of a silicon oxide film or a silicon nitride film formed by means of a plasma CVD method and having a thickness of 50 nm. The insulating layer 86b is utilized to prevent Cu from diffusing into an inter-level insulating film.

Figure 8D:
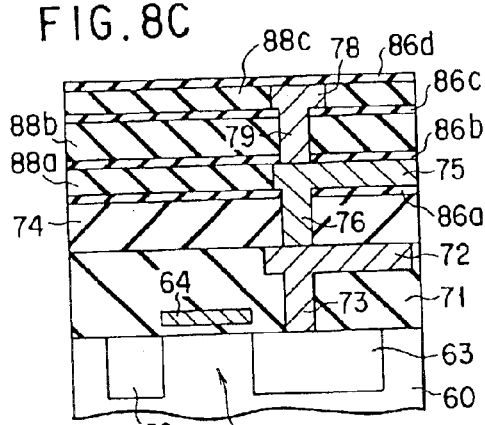

Then, as shown in FIG. 8D, the insulating layer 86b is covered with an insulating layer 88b consisting of an organic SOG layer, which is then covered with an insulating layer 86c consisting of a silicon oxide film or a silicon nitride film formed by means of a plasma CVD method and having a thickness of 50 nm. Then, the insulating layers 86b, 88b, 86c, and 88c are subjected to a step of patterning and a step of forming a trench, and Cu/TaN is embedded in the trench to form a wiring layer 78 and a via plug 79. Then, the insulating layer 88c and the wiring layer 78 are covered with an insulating layer 86d consisting of a silicon oxide film or a silicon nitride film formed by means of a plasma CVD method and having a thickness of 50 nm.

Then, as shown in FIG. 8E, the insulating layer 86d is covered with a reinforcement insulating layer 80 consisting of a silicon oxide film formed by means of a plasma CVD method and having a thickness of 1 $\mu$m. Then, a Cu/TaN pad and wiring layer 81 is formed on the insulating layer 80 and connected to the wiring layer 78 by a via plug 82 (dual damascene method).

Figure 8F:
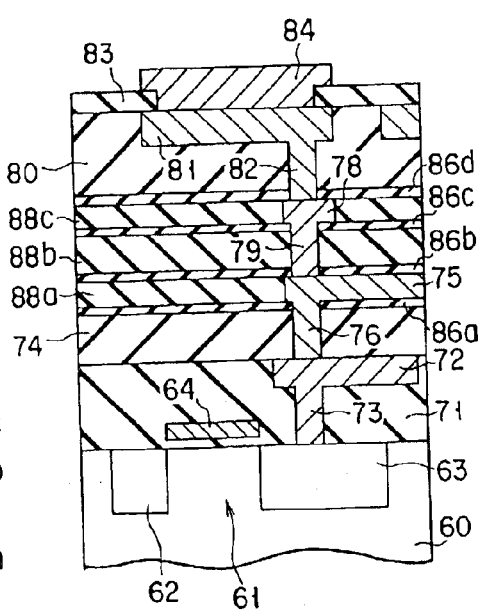

Then, as shown in FIG. 8F, the insulating layer 80 and the pad and wiring layer 81 are covered with a passivation layer 83 consisting of a silicon nitride film formed by means of a plasma CVD method. Then, a through hole is formed in the passivation layer 83 and an Al/BM electrode pad 84 is formed in the through hole.

In this structure, the reinforcement insulating layer 80 consisting of a silicon oxide film formed by means of a plasma CVD method is arranged directly under the electrode pads 81 and 84. As a result, the structure can withstand a mechanical impact applied thereto in a bonding step. On the other hand, the SOG insulating layers 74, 88a, 88b, and 88c having a low dielectric constant are used as intermediate insulating layers, thereby realizing a semiconductor device which can operate at a higher speed.

In this embodiment, the insulating layer consisting of a silicon oxide film or a silicon nitride film (preferably of a silicon nitride film) formed by means of a plasma CVD method is arranged under the wiring trench of each level and utilized as an etching stopper for etching the trench. However, the etching stopper layers may be omitted to realize an LSI which can operate at a higher speed.

Furthermore, the insulating layer consisting of a silicon oxide film or a silicon nitride film (preferably of a silicon nitride film) formed by means of a plasma CVD method is arranged to cover the Cu wiring layer of each level utilized as a Cu-diffusion preventing layer. The diffusion preventing layers may be also omitted for the same reason. This omission may be adopted, for example, where the spin-coated insulating layers are formed of a film having a function of preventing Cu from diffusing, or where the upper portion of each Cu wiring layer is surrounded by a barrier metal. Furthermore, where Al or W is used as a wiring material, diffusion of the wiring material into the inter-level film is negligable, and thus no diffusion preventing layer is necessary.

In this embodiment, the uppermost wiring and pad layer is formed by means of a dual damascene method. Instead, the via plug and the wiring layer may be separately embedded, using a single damascene method. In this case, an insulating film at the same level as the uppermost wiring layer and an insulating film thereunder are deposited in different steps. Accordingly, the insulating film at the same level as the uppermost wiring layer and the insulating film thereunder may be formed of the same material or different materials.

Seventh Embodiment

Figure 9:
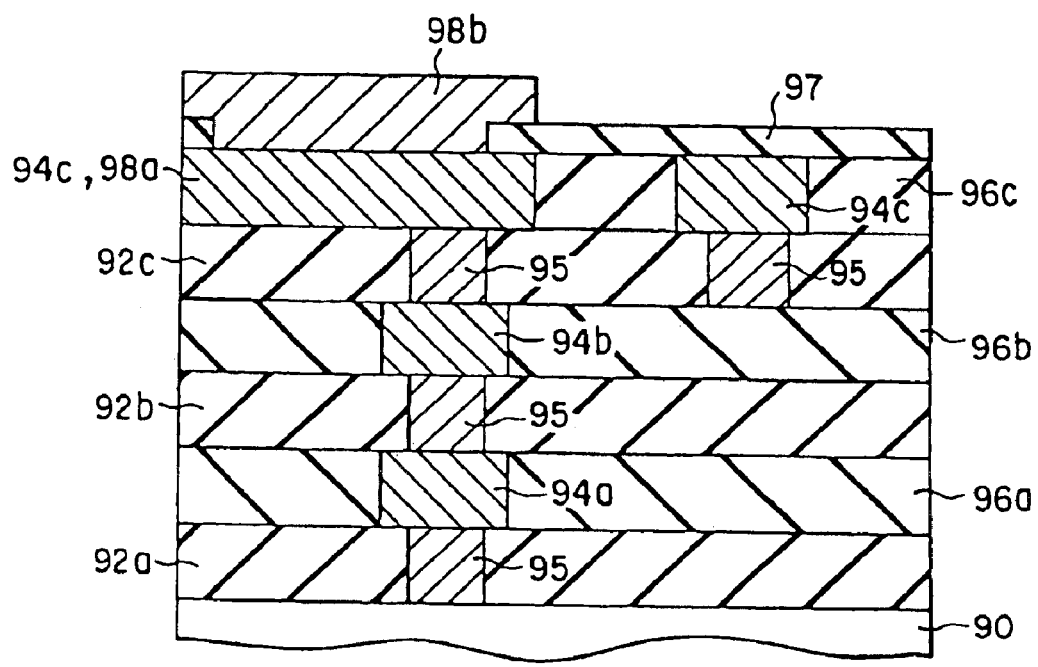
FIG. 9 is a cross-sectional view showing a wiring structure of a semiconductor device according to a seventh embodiment of the present invention.
Figure 10A:
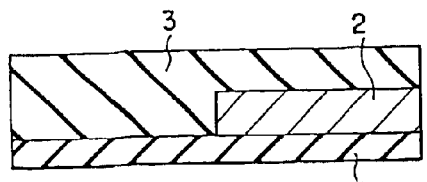
FIGS. 10A to 10F are cross-sectional views showing steps of a conventional method of fabricating a wiring structure of a semiconductor device.
Figure 10B:
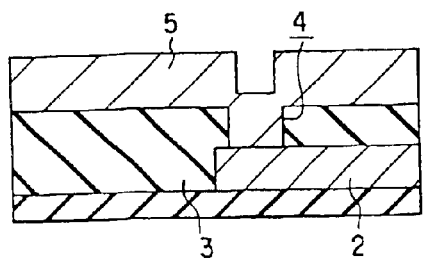
Figure 10C:
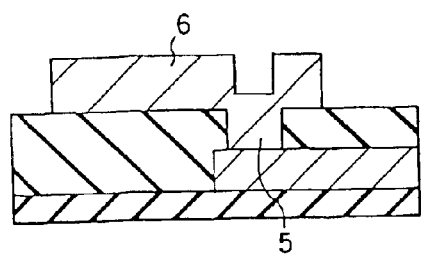
Figure 10E:
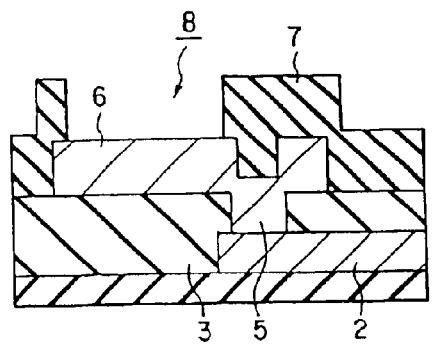
Figure 10F:
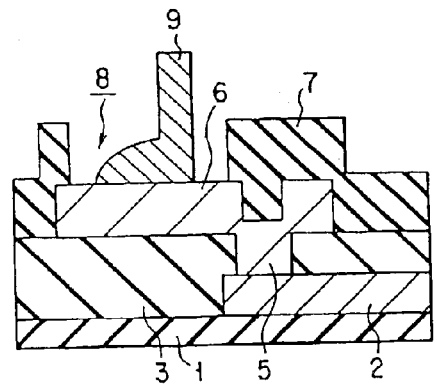
Figure 10D:
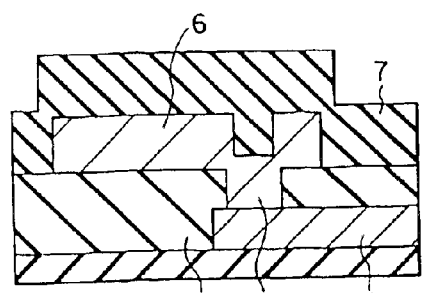

FIG. 9 is a cross-sectional view showing a wiring structure of a semiconductor device according to a seventh embodiment of the present invention.

On a semiconductor substrate 90, there are a plurality of wiring layers 94a, 94b, and 94c at different levels. A plurality of inter-level insulating layers (reinforcement insulating layers) 92a, 92b, and 92c are arranged among the substrate 90 and the wiring layers 94a, 94b, and 94c. Furthermore, a plurality of embedding insulating layers 96a, 96b, and 96c are arranged at substantially the same level as the wiring layers 94a, 94b, and 94c to surround the wiring layers 94a, 94b, and 94c. The wiring layers 94a, 94b, and 94c of the different levels are electrically connected by conductive via plugs 95.

Each of the inter-level insulating layers 92a, 92b, and 92c is a reinforcement insulating layer (with a Young's modulus of 50 GPa or more, and a density of 2.0 g/cm$^3$ or more) consisting of a silicon oxide film or a silicon nitride film formed by means of a plasma CVD method. Each of the embedding insulating layers 96a, 96b, and 96c consists of an organic SOG layer (of, e.g., SiO(CH$_3$)$_x$, with a relative dielectric constant of 2.5, a Young's modulus of less than 10 GPa, and a density of less than 2.0 g/cm$^3$) formed by means of a spin coating method.

The wiring layer 94c and the inter-level insulating layer 92c of the uppermost level are covered with a passivation layer 97 consisting of, e.g., SiN. A through hole is formed in the passivation layer 97 to expose that part 98a of the uppermost wiring layer 94c which is used as a pad, and an electrode pad 98b is arranged in the through hole.

In this structure, the reinforcement insulating layer 92c consisting of a silicon oxide film or a silicon nitride film formed by means of a plasma CVD method is arranged directly under the electrode pads 98a and 98b. As a result, the structure can withstand a mechanical impact applied thereto in a bonding step. On the other hand, the SOG insulating layers 96a and 96b having a low dielectric constant are used as intermediate insulating layers, thereby realizing a semiconductor device which can operate at a higher speed.

In the first to seventh embodiments, a reinforcement insulating layer is located at any place between an electrode pad and a wiring layer under the pad. However, where the reinforcement insulating layer is arranged directly under the electrode pad, it can provide a most effective function. Furthermore, a plurality of reinforcement insulating layers may be inserted between the electrode pad and the wiring layer.

As a method of forming a via plug under an electrode pad, a selective-CVD method or a blanket-CVD method for forming a W via plug, or a method using an Al pillar for forming a via plug may be used other than a sputtering-embedding method, after a via hole is formed. As a wiring material, Cu, Al, W, or the like may be used.

In the first to seventh embodiments, an SOG film is described as an example of an inter-level insulating layer having a Young's modulus of less than 50 GPa and typically of 10 GPa or less, and a density of less than 2.0 g/cm$^3$, but the method of forming the inter-level insulating layer is not limited to a spin coating method. As far as, the requirements described above, such as values of the Young's modulus, the density, and so forth, are satisfied, another low-dielectric constant film having a relative dielectric constant $\underline{k}$ of 3.0 or less may be used.

Similarly, in the first to seventh embodiments, a silicon oxide film or a silicon nitride film formed by means of a plasma CVD method is described as a reinforcement insulting layer having a Young's modulus of 50 GPa or more, and a density of 2.0 g/cm$^3$ or more, but as far as the requirements described above, such as values of the Young's modulus, the density, and so forth, are satisfied, another reinforcement insulating film of, e.g., SiC, SiOF, or PSG, may be used.

As has been described, a wiring structure of a semiconductor device and a method of fabricating the same allow an inter-level insulating film to have a lower dielectric constant, and on the other hand, prevent a crack from being generated in the inter-level insulating film under an electrode pad when a connecting member, such as a wire, is bonded to the electrode pad.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an active device structure formed in the substrate, and comprising a connection region on the substrate;
   a plurality of first layer-structure units stacked on or above the active device structure, each of the first layer-structure unit comprising
      a first insulating layer having a first relative dielectric constant, the first insulating layer including a first recess formed in a surface of the first insulating layer and a first via hole formed therein, and
      a first wiring layer and a first via plug electrically connected to each other, and disposed in the first recess and the first via hole, respectively, the first via plug being electrically connected to the connection region;
   a second layer-structure unit disposed on or above the first layer-structure units, the second layer-structure unit comprising
      a second insulating layer containing silicon and having a second relative dielectric constant higher than the first relative dielectric constant and a Young's modulus larger than that of the first insulating layer, the second insulating layer including a second via hole formed therein, and
      a second via plug disposed in the second via hole and electrically connected to the first wiring layer;

a connection pad disposed on the second insulating layer and electrically connected to the second via plug;

a passivation film disposed on the second insulating layer and consisting essentially of a material different from that of the second insulating layer, the passivation film having an opening at a position corresponding to the connection pad;

a conductive pad disposed in the opening of the passivation film and on the connection pad, the conductive pad having a top higher than that of the passivation film;

a lower insulating layer containing silicon, disposed on the substrate and between the substrate and the first layer-structure units, and consisting essentially of a material different from those of the first and second insulating layers, the lower insulating layer including a lower via hole formed therein; and a lower via plug disposed in the lower via hole, and electrically connected to the connection region, the first via plug being electrically connected to the connection region through the lower via plug.

2. The device according to claim 1, wherein the second insulating layer includes a second recess formed in a surface of the second insulating layer, and the connection pad is disposed in the second recess.

3. The device according to claim 2, wherein the second recess and the second via hole are connected to each other at a connecting portion disposed in the second insulating layer, and the second recess has a width larger than the width of the second via hole at the connecting portion in a cross section.

4. The device according to claim 1, wherein the connection pad comprises a Cu layer, and the conductive pad comprises an Al layer, with a barrier layer interposed between the connection pad and the conductive pad.

5. The device according to claim 4, wherein the barrier layer comprises one of a TiN layer and a TaN layer.

6. The device according to claim 1, wherein the first insulating layer has a relative dielectric constant of 3.0 or less.

7. The device according to claim 1, wherein the first insulating layer has a Young's modulus of less than 50 GPa, and the second insulating layer has a Young's modulus of 50 GPa or more.

8. The device according to claim 7, wherein the first insulating layer has a Young's modulus of 10 GPa or less.

9. The device according to claim 1, wherein the first insulating layer has a density of less than 2.0 g/cm$^3$.

10. The device according to claim 1, wherein the second insulating layer has a thickness of 100 nm or more.

11. The device according to claim 1, wherein the first insulating layer contains silicon.

12. The device according to claim 11, wherein the first insulating layer consists essentially of a silicon oxide containing an organic material.

13. The device according to claim 12, wherein the second insulating layer consists essentially of a material selected from the group consisting of a silicon oxide and a silicon nitride.

14. The device according to claim 1, wherein the lower insulating layer comprises a phospho-silicate glass layer.

15. The device according to claim 1, wherein the active device structure comprises a transistor.

16. The device according to claim 1, wherein each of the first layer-structure units further comprises an etching stopper layer disposed to horizontally divide the first insulating layer into an upper portion and a lower portion, such that the first recess is formed in the upper portion, and the first via hole is formed in the lower portion.

* * * * *

UNITED STATES PATENT AND TRADEMARK OFFICE
CERTIFICATE OF CORRECTION

PATENT NO. : 6,864,583 B2
DATED : March 8, 2005
INVENTOR(S) : Matsunaga et al.

It is certified that error appears in the above-identified patent and that said Letters Patent is hereby corrected as shown below:

Column 12,
Line 47, change "unit" to -- units --.

Signed and Sealed this

Thirty-first Day of May, 2005

JON W. DUDAS
*Director of the United States Patent and Trademark Office*